US006578881B2

United States Patent
Lynn et al.

(10) Patent No.: US 6,578,881 B2
(45) Date of Patent: Jun. 17, 2003

(54) FLUID-TIGHT PIPE UNION

(76) Inventors: David Mark Lynn, 506 E. 45th St., Eagle, ID (US) 83714; Melvin Marion Clarkson, 506 E. 45th St., Boise, ID (US) 83714

( * ) Notice: Subject to any disclaimer, the term of this patent is extended or adjusted under 35 U.S.C. 154(b) by 0 days.

(21) Appl. No.: 09/884,705

(22) Filed: Jun. 18, 2001

(65) Prior Publication Data

US 2002/0113438 A1 Aug. 22, 2002

Related U.S. Application Data

(63) Continuation-in-part of application No. 09/788,060, filed on Feb. 17, 2001.

(51) Int. Cl.$^7$ ................................. F16L 19/00
(52) U.S. Cl. ....................... 285/354; 285/387
(58) Field of Search ................ 285/354, 386, 285/387, 388

(56) References Cited

U.S. PATENT DOCUMENTS

| | | | | |
|---|---|---|---|---|
| 793,209 A | * | 6/1905 | Miller ..................... 285/387 X |
| 1,209,887 A | * | 12/1916 | Rothenbucher ......... 285/354 X |
| 1,268,259 A | * | 6/1918 | Martin .................... 285/354 X |
| 1,446,057 A | * | 2/1923 | Moyen ........................ 285/354 |
| 1,906,826 A | * | 5/1933 | Smith et al. ............. 285/354 X |
| 1,961,989 A | * | 6/1934 | Shippee .................. 285/386 X |
| 2,035,978 A | * | 3/1936 | Parker ..................... 285/354 X |
| 2,208,353 A | * | 7/1940 | Woolley et al. ......... 285/354 X |
| 2,569,333 A | * | 9/1951 | Peterson ..................... 285/354 |
| 2,829,673 A | * | 4/1958 | Reese ..................... 285/354 X |
| 2,878,039 A | * | 3/1959 | Hoegee et al. .......... 285/354 X |
| 3,186,740 A | * | 6/1965 | Lee ............................. 285/354 |
| 4,057,268 A | | 11/1977 | Sicard |
| 4,165,106 A | * | 8/1979 | Gladden .................. 285/354 X |
| 4,802,695 A | * | 2/1989 | Weinhold ................ 285/354 X |
| 4,846,508 A | | 7/1989 | Pallini, Jr. et al. |
| 4,867,483 A | * | 9/1989 | Witt et al. ............... 285/354 X |
| 5,016,920 A | * | 5/1991 | Anderson ................ 285/354 X |
| 5,082,391 A | * | 1/1992 | Florida .................... 285/387 X |
| 5,306,052 A | * | 4/1994 | McGushion ............. 285/354 X |
| 5,362,109 A | * | 11/1994 | Pacht ...................... 285/354 X |
| 5,605,358 A | * | 2/1997 | Mohlenkamp ........... 285/388 X |
| 5,725,259 A | * | 3/1998 | Dials ....................... 285/354 X |
| 6,050,609 A | * | 4/2000 | Boscaljon et al. ....... 285/354 X |
| 6,179,348 B1 | * | 1/2001 | Okamoto ................. 285/354 X |

* cited by examiner

Primary Examiner—Lynne H. Browne
Assistant Examiner—David E. Bochna
(74) Attorney, Agent, or Firm—Angus C. Fox III

(57) ABSTRACT

A fluid-tight union for reversably interconnecting lengths of coaxial pipe includes: a first annular fitting, having a circumferential flange, attachable to a connection end of a first length of pipe; a second annular fitting, having a circumferential shoulder, attachable to a connection end of a second length of pipe; a clamping collar comprised of arcuate segments which incorporate both an inwardly-angled clamping ledge that engages an overhanging step on the circumferential shoulder of the second annular fitting and at least one internal, inwardly-angled, spiral, circumferential thread spaced apart from the clamping ledge; and a retainer ring sized so as to be slidable over the first annular fitting, and rotatable against the rear face of the circumferential flange, the retainer ring incorporating external, spiral, circumferential threads that are angled away from the flange, the external threads of the retainer ring engaging the internal threads of the clamping collar to draw the clamping ledge and engaged second annular fitting against the flange as the retainer ring is rotated in a thread engaging direction.

20 Claims, 11 Drawing Sheets

FLUID-TIGHT PIPE UNION

This application is continuation-in-part of application Ser. No. 09/788,060, titled IMPROVED MAGNETRON TARGET AND APPARATUS FOR AFFIXING THE TARGET TO A ROTATABLE SUPPORT SPINDLE, which was filed on Feb. 17, 2001.

FIELD OF THE INVENTION

This invention relates generally to pipe fittings and, more particularly, to fluid-tight and liquid-tight pipe unions which permit two coaxial sections of pipe to be connected and, subsequently, disconnected without rotating the pipe sections.

DESCRIPTION OF THE PRIOR ART

Long runs of pipe typically require one or more couplings which join individual sections of pipe. The simplest type of coupling is a standard coupling. Larger in diameter than the pipe sections to be joined, the standard coupling is a short piece of pipe internally threaded at both ends. Each threaded end receives an externally threaded end of a pipe section. In order to make the connection, either the pipe section or the standard coupling must be axially rotated. Unions are typically much more costly than standard couplings. The advantage of a union is that the individual pipe sections need not be axially rotated to make the connection. A standard pipe union typically consists of three major components: a flanged first fitting that is internally-threaded to receive the externally threaded end of a first pipe section; an internally threaded collar that slides over the first fitting, the collar having an inwardly-projecting rim at one end that abuts against the flange of the first fitting; and a second fitting that is internally threaded to receive the externally threaded end of a second pipe section, the second fitting also having external threads sized to engage the internal threads of the collar.

A variety of pipe unions have been designed and manufactured over the years. For example, U.S. Pat. No. 4,586,735 to Innes discloses a pipe union having a gasket and retaining/centering device for improved sealing of the joint. U.S. Pat. No. 5,529,284 to Berger, et al. discloses a reusable pipe union that is especially adapted to use over a wide temperature range and which can be repeatedly cycled between extremes of temperatures without the need for retightening. U.S. Pat. No. 4,057,268 to Sicard discloses a disconnectable pipe union designed for robotic assembly at ocean depths beyond those accessible by divers. The union is comprised of two half unions which are secured together with an assembling nut with a toothed ring. Each half union includes a jaw which cooperates with a sliding ring that is displaced by the assembling nut.

The present invention represents an adaptation of an apparatus, having common inventorship, that was originally designed to affix an improved magnetron target to a rotatable support spindle. The improved target includes a circumferential shoulder which includes an extensive circumferential lip which fits over the spindle's outer mating circumferential edge. The shoulder terminates in a circumferential, inwardly-angled, overhanging step. The target and spindle are coupled together with an generally annular retainer ring having external, outwardly-facing circumferential threads, and a split clamping collar having an inwardly-angled clamping ledge at one end thereof that mates with the overhanging circumferential step on the target, and internal, inwardly-facing circumferential threads at the other end, which mate with the external threads of the retainer ring. The retainer ring is rotated with a spanner wrench so as to engage the threads of the split clamping collar. As the retainer ring engages the rear face of the spindle flange, the clamping collar and retainer ring act in concert to draw the target and spindle together as a unified assembly. An O-ring is employed to maintain a fluid-tight seal between the target and the spindle.

SUMMARY OF THE INVENTION

This invention embraces multiple embodiments of a fluid-tight union for reversably interconnecting first and second lengths of coaxial pipe, said union. The union is intended for use with vacuum and pressurized gas lines and pressurized liquid lines. All of the embodiments share the following common elements:

a first annular fitting attachable to a connection end of said first length of pipe, said first fitting incorporating a circumferential flange, said flange having a rear face and front face which faces said second length of pipe;

a second annular fitting attachable to a connection end of said second length of pipe, said second fitting having a circumferential shoulder adjacent a junction with said first fitting, said shoulder terminating in an inwardly-angled, overhanging circumferential step that faces away from said junction;

a clamping collar comprised of arcuate segments, which are collectively sized to generally and coaxially surround both said first and second fittings, said collar incorporating, both an inwardly-angled clamping ledge that engages the overhanging step of the second fitting and at least one internal, inwardly-angled, spiral, circumferential thread spaced apart from said clamping ledge; and a retainer ring sized so as to be slidable over said first fitting, and rotatable against the rear face of said circumferential flange, said retainer ring incorporating external, spiral, circumferential threads that are angled away from the said flange, the external threads of said retainer ring engaging the internal threads of said clamping collar to draw the clamping ledge and engaged second fitting against the flange as the retainer ring is rotated in a thread engaging direction.

Any of the embodiments may also include a metal seal crushable between the first and second annular fittings. Alternatively, they may include a rubber O-ring seal compressible between the first and second annular fittings. A rubber O-ring seal may be positioned in one of several locations: within a groove on a face of either the first or second annular fittings; within a corner of a cylindrical recess on either the first or second annular fittings, the recess sized to receive a generally cylindrical projection from the other annular fitting, a circumferential edge of which compresses the O-ring about its circumference; or within a groove within a cylindrical recess on either the first or second annular fittings, the recess sized to receive a cylindrical projection from the other annular fitting, the cylindrical surface of which compresses the O-ring about its circumference. A crushable metal seal, on the other hand may be located within a corner of a cylindrical recess, being crushable by the circumferential edge when the two annular fittings are brought together.

Another variation is the manner of attachment of the first and second fittings to the first and second pipe sections. For one embodiment of the invention, each of the fittings is butt-welded to its respective pipe section. For another, each of the fittings is threadably attached to its respective pipe section.

For a preferred embodiment of the invention, the clamping collar is comprised of a pair of generally 180-degree arcuate segments. An additional feature that may be incorporated in any of the embodiments is the hingeable interconnection of the arcuate segments.

The external threads of the retainer ring and the internal threads of the clamping collar may be of either a left-handed or right-handed spiral configuration.

For one embodiment of the invention, provision is made for disconnection of the union without the need for separating the joined pipe sections in a direction along their axes. In order to accomplish this object, an annular collar is provided on either of the annular fittings, which can be slid forward to centerably engage the other fitting. The annular collar may be retracted in order to disengage the two abutting fittings in a sidewise manner.

PREFERRED EMBODIMENT OF THE INVENTION

Figure 1:
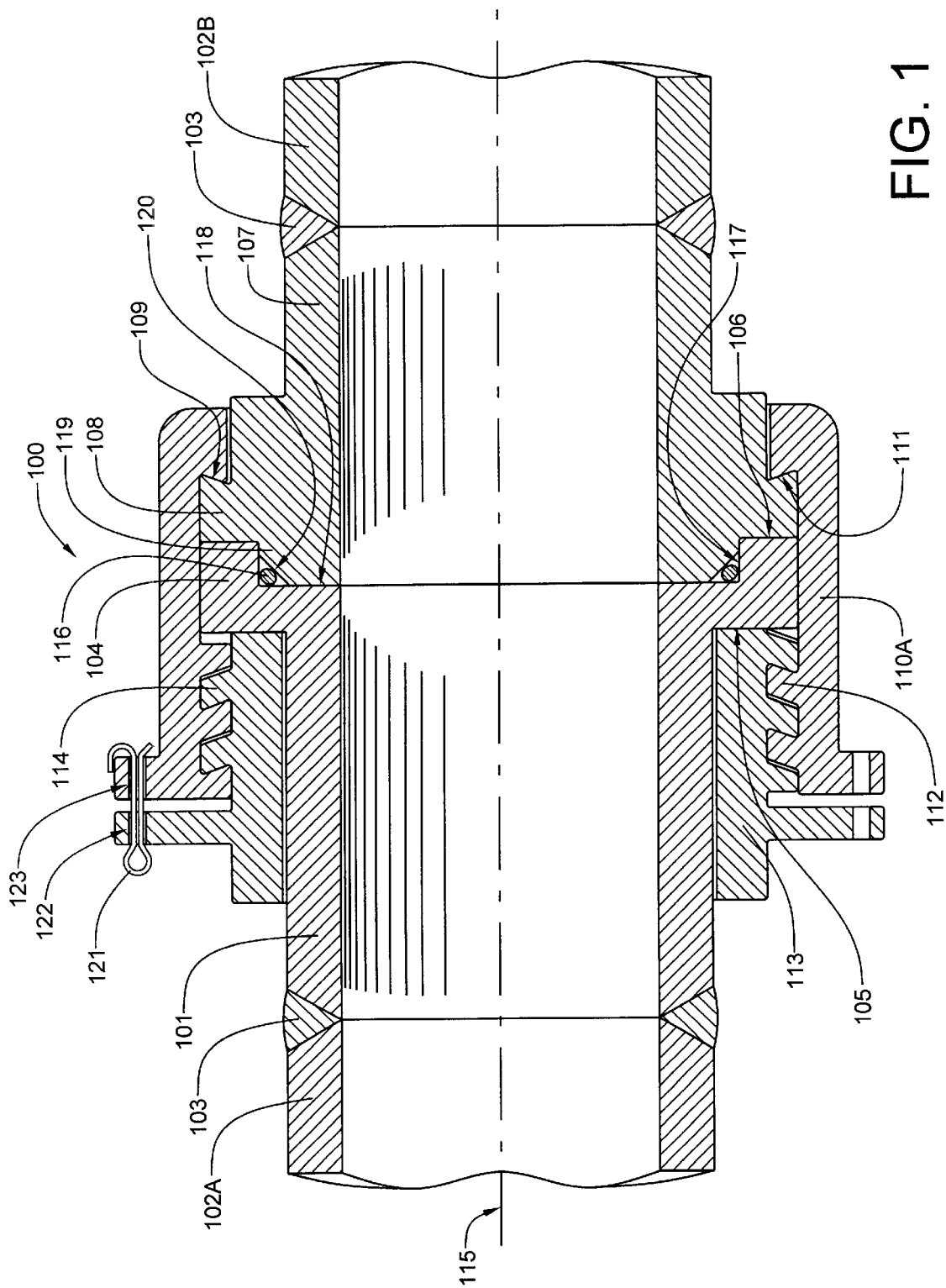
FIG. 1 is a cross-sectional view of a first embodiment of the fluid-tight pipe union.

The present invention embraces multiple embodiments of a fluid-tight union for reversably interconnecting first and second lengths of coaxial pipe, said union. The various embodiments will now be described in detail with reference to the attached drawing figures. Each of the elements of the second, third, fourth, fifth and sixth embodiments of the invention (200, 300, 400, 500 and 600, respectively), which corresponds to an element of the first embodiment union 100, is given the same number, or the same number plus multiples of 100 if the two elements are different, though similar. Thus, the first annular fitting of the second embodiment is numbered 201, the second annular fitting is numbered 206, and so forth; the first annular fitting of the third embodiment is numbered 301, the second annular fitting is numbered 306, and so forth.

Referring now to FIG. 1, a first embodiment fluid-tight coupling 100 is shown in an assembled configuration. The coupling 100 comprises a first annular fitting 101 attachable to a connection end of a first length of pipe 102A. Connection between the first fitting 101 and the first length of pipe 102A is made by means of a weld 103. The first annular fitting 101 incorporates a circumferential flange 104, the flange 104 having a rear face 105 and an opposed front face 106; a second annular fitting 107 attachable to a connection end of a second length of pipe 102B. Connection between the second annular fitting 107 and the second length of pipe 102B is also made by means of a weld 103. The second annular fitting 107 has a circumferential shoulder 108 which terminates in an inwardly-angled, overhanging circumferential step 109 that faces the second length of pipe; a clamping collar 110 comprised of arcuate segments 110A and 110B (not shown), which are collectively sized to generally and coaxially surround both the first fitting 101 and the second fitting 106, said collar 110 incorporating, both an inwardly-angled clamping ledge 111 that engages the overhanging step 109 of the second fitting 107 and at least one internal, inwardly-angled, spiral, circumferential thread 112 spaced apart from the clamping ledge 111; and a retainer ring 113 sized so as to be slidable over said first fitting 101, and rotatable against the rear face 105 of the circumferential flange 104, said retainer ring 113 incorporating external, spiral, circumferential threads 114 that are angled away from the flange 104, the external threads of said retainer ring 113 engaging the internal threads 112 of said clamping collar 110 to draw the clamping ledge 111 and engaged second fitting 107 against the flange 104 as the retainer ring 113 is rotated in a thread engaging direction.

Still referring to FIG. 1, it will be noted that both the first and second annular fittings 101 and 107, respectively, are axially symmetrical about axis 115. Sealing between the first annular fitting 101 and the second annular fitting 107 is accomplished by compression of a resilient rubber O-ring seal 116 which is positioned within a corner 117 of a cylindrical recess 118 within the first annular fitting 101. The recess 118 is sized to receive a generally cylindrical projection 119 of the second annular fitting 107, a beveled circumferential edge 120 of which compresses the O-ring seal 116 about its circumference. Of course, the same result may be achieved by equipping the second annular fitting 107 with the recess 118 and the first annular fitting 101 with the cylindrical projection 119. It will also be noted that said retainer ring 113 may be rotationally locked to the clamping collar 110 through the use of a cotter pin 121 inserted through both an aperture 122 in the retainer ring 113 and through an aperture 123 in the clamping collar 110.

Figure 2:
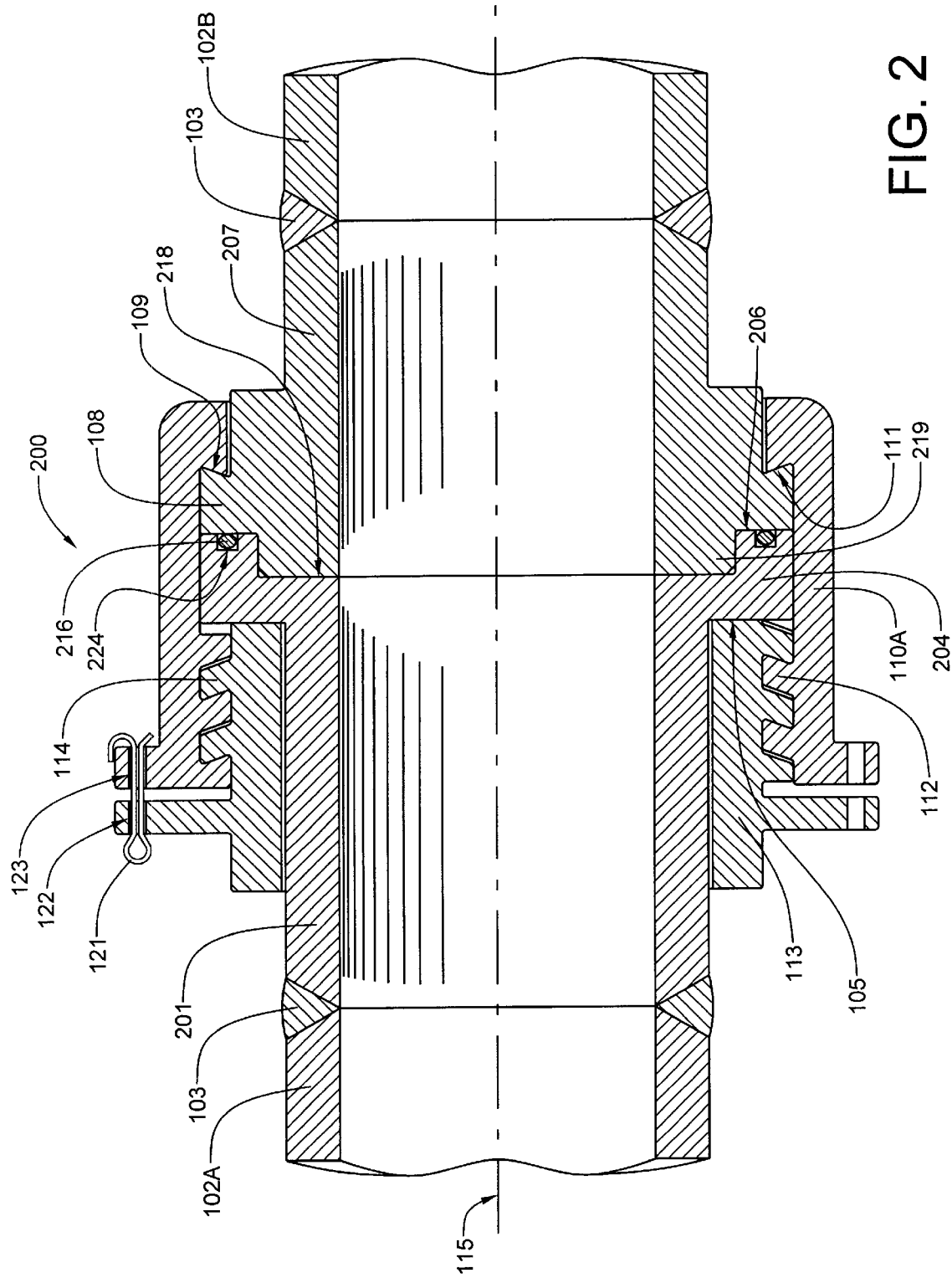
FIG. 2 is a cross-sectional view of a second embodiment of the fluid-tight pipe union.

Referring now to FIG. 2, the second embodiment of the fluid-tight pipe union 200 features a different seal configuration as compared with the union 100 of FIG. 1. The primary difference between the first and second embodiments is the presence of a circumferential groove 224 on the front face 206 of the flange 204. A resilient rubber O-ring seal 216, which fits in the groove 224 is compressed by the second annular fitting 207 when the retainer ring 113 is tightened against the rear face 206 of the flange 204.

Figure 3:
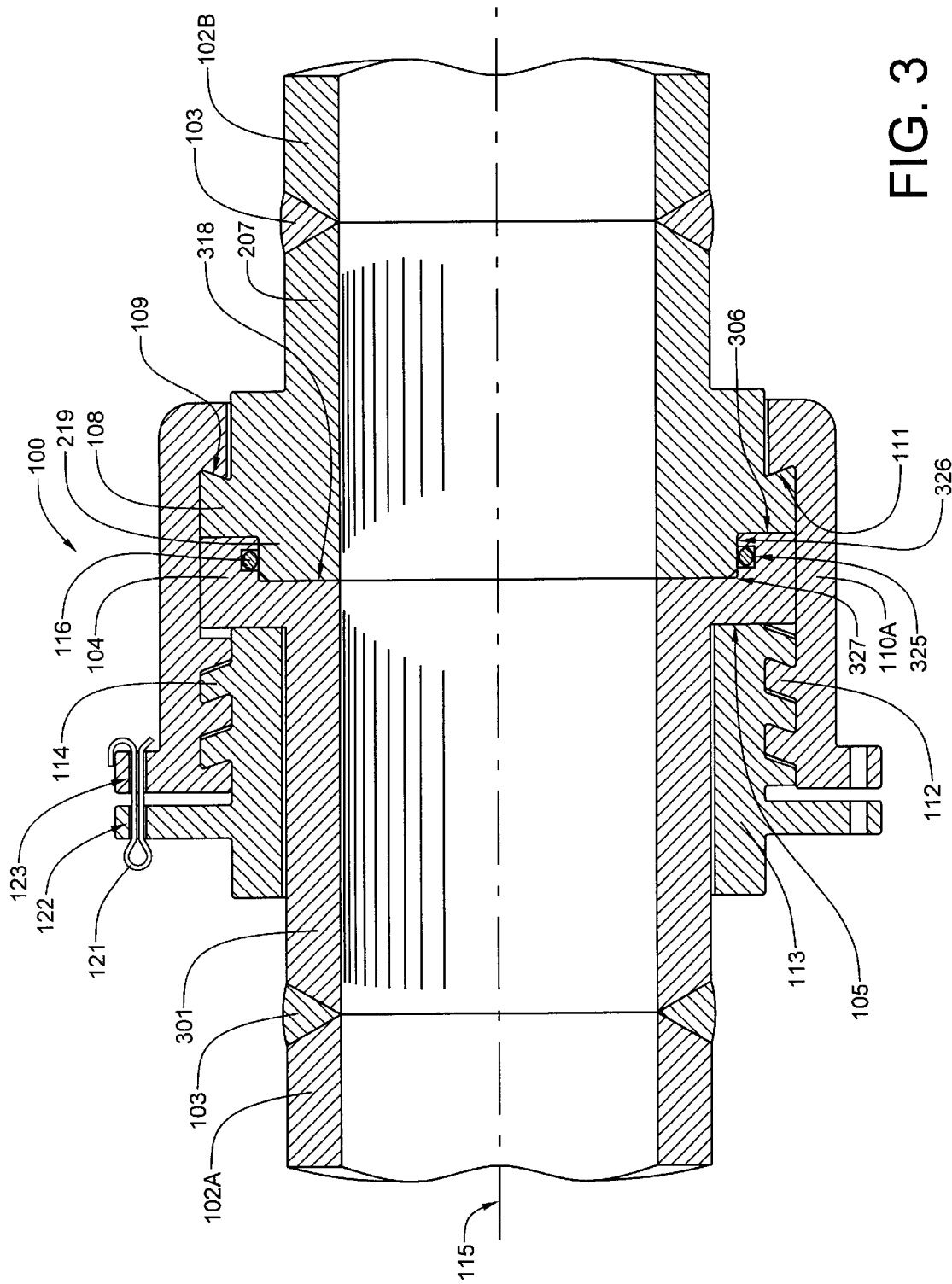
FIG. 3 is a cross-sectional view of a third embodiment of the fluid-tight pipe union.

Referring now to FIG. 3, a resilient rubber O-ring seal 316 is inserted within an inwardly-facing annular groove 325 within a cylindrical recess 318 in the first annular fitting 301. The cylindrical surface 326 of a cylindrical projection 219 compresses the O-ring seal 316, thereby sealing the joint 327 between the first and second annular fittings 301 and 207, respectively.

Figure 4:
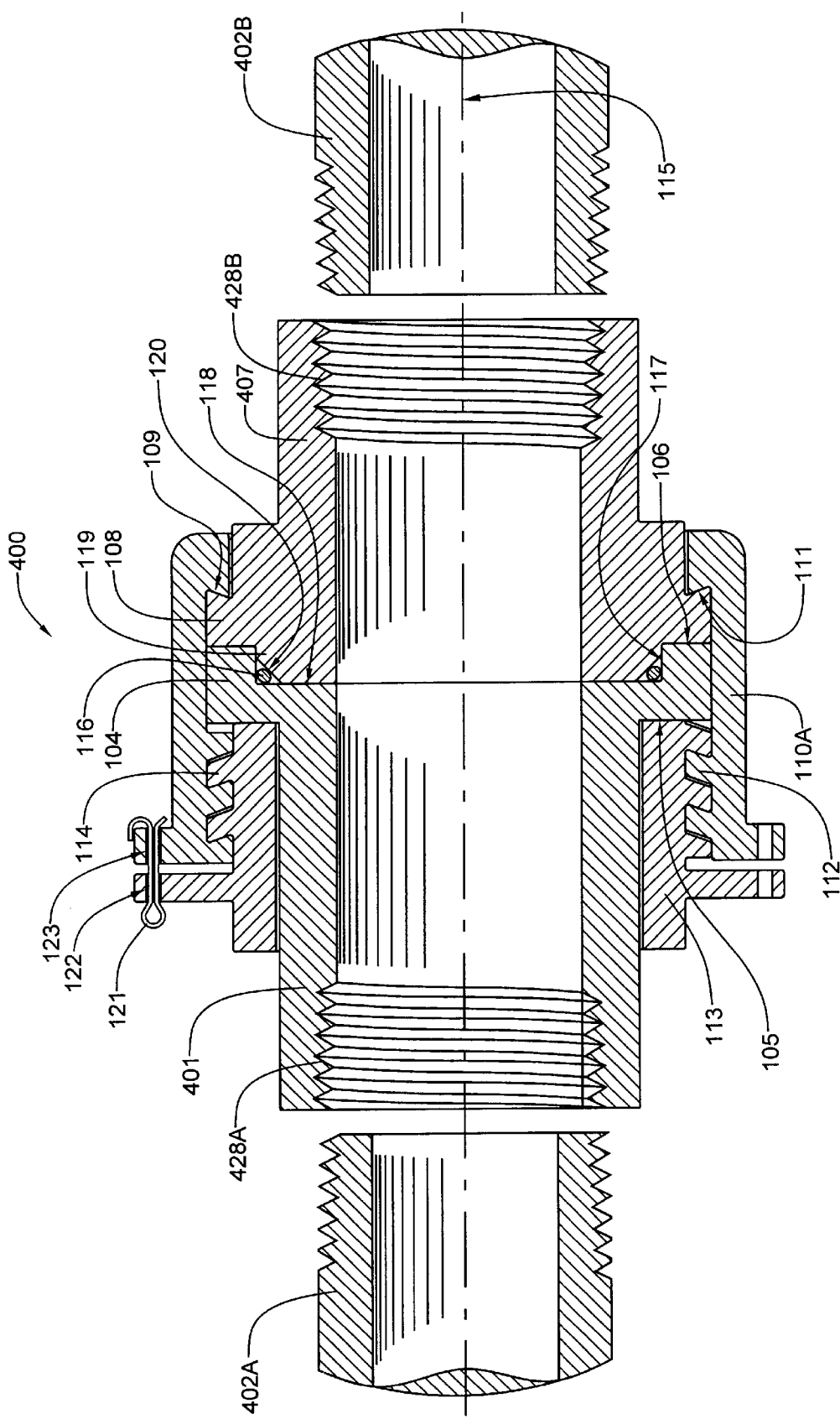
FIG. 4 is a cross-sectional view of a fourth embodiment of the fluid-tight pipe union.

Referring now to FIG. 4, the fourth embodiment of the fluid-tight pipe union 400 is a modification of the first embodiment fluid-tight union 100 of FIG. 1, whereby it has been modified to include pipe receiving threads 428A and 428B on first annular fitting 401 and second annular fitting 407, respectively. Threaded connection of the first and second annular pipe sections 401 and 407 to pipe sections to be joined may be preferred over the butt welding of the annular fittings 101 and 107 required for the first embodiment union 100 of FIG. 1.

Figure 5:
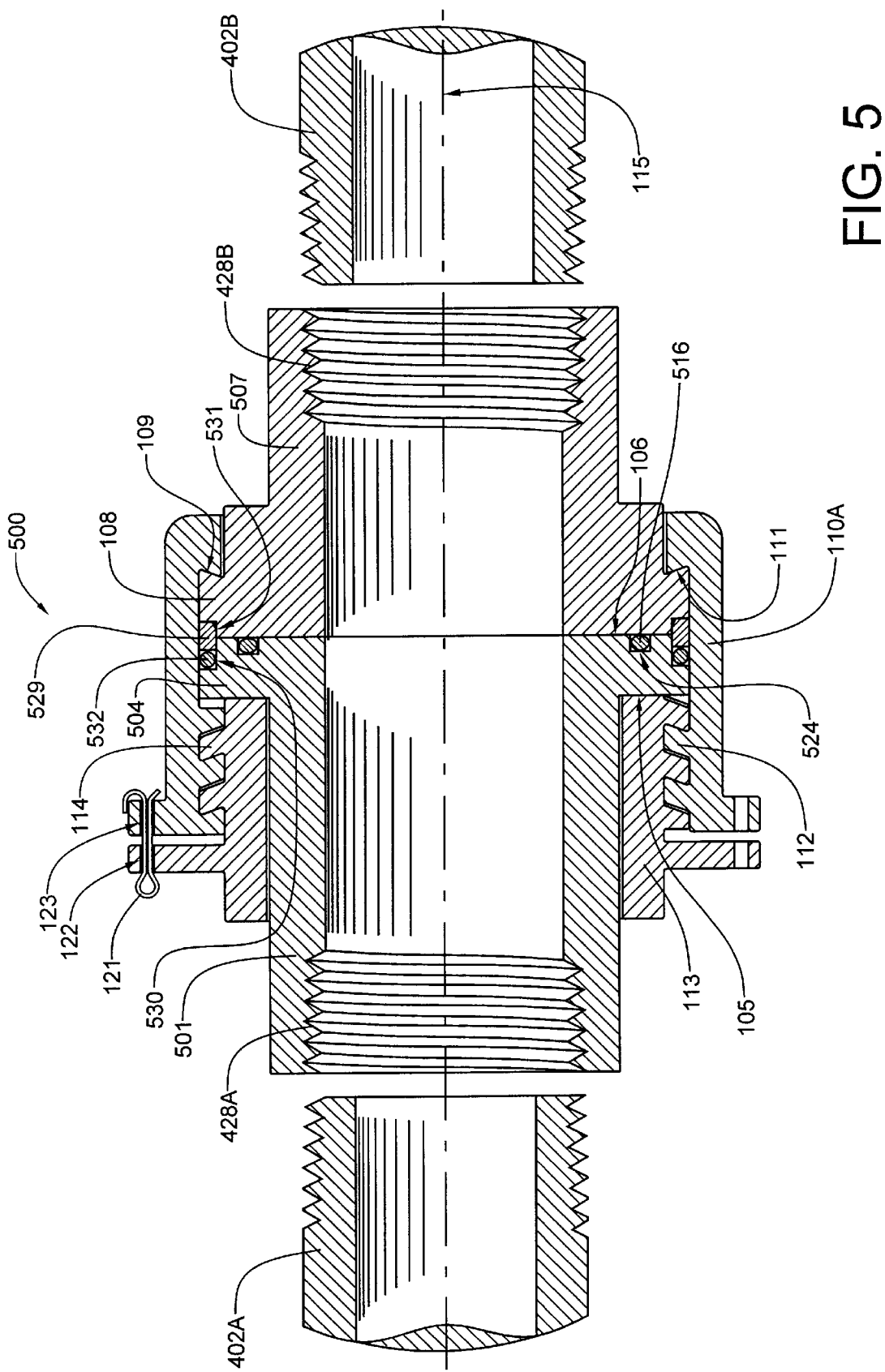
FIG. 5 is a cross-sectional view of a fifth embodiment of the fluid-tight pipe union.

Referring now to FIG. 5, the fifth embodiment fluid-tight union 500 has an O-ring sealing configuration similar to that of the second embodiment union 200 of FIG. 2. However, the fifth embodiment union 500 has been modified to eliminate the centering function provided by the recess 219 and cylindrical projection 220. For the fifth embodiment union, the centering function is provided by a collar 529 that is slidable within a first annular recess 530 cut into the outer edge of the front face 505 of the flange 508. A second annular recess 531 is cut into the shoulder 108 of the second annular fitting 507. A band or ring 532 may be removably inserted behind the collar 529 in order to position the collar 529 in its position as a centering guide as shown in the drawing Figure. It may be removed so that the collar may be completely retracted into the recess 530 if sideways disassembly of the union, without movement of the pipes along their longitudinal axes, is contemplated.

Figure 6:
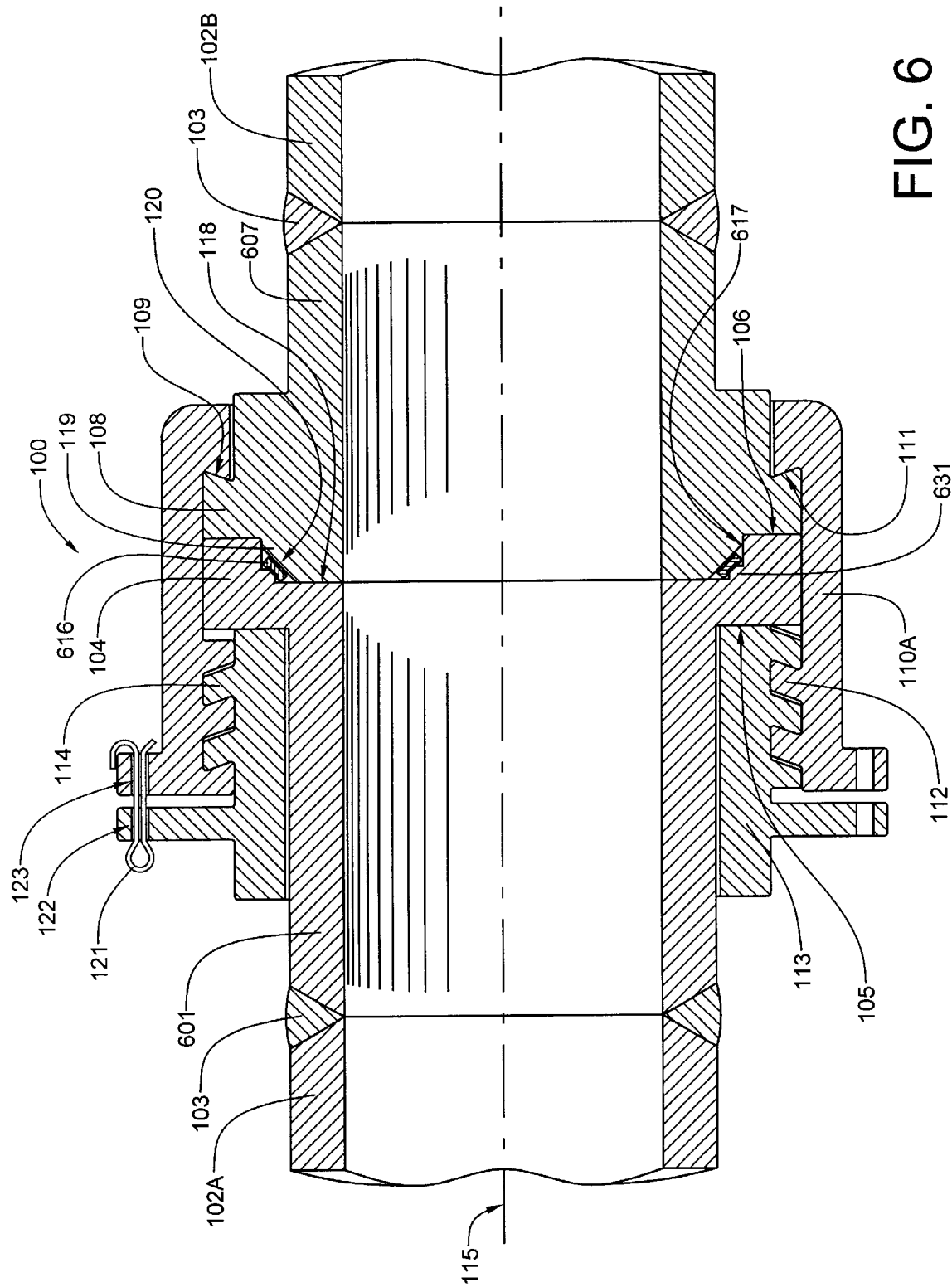
FIG. 6 is a cross-sectional view of the first embodiment union of FIG. 1, but with a crushable metal seal substituted for the rubber O-ring seal.

Referring now to FIG. 6, a sixth embodiment fluid-tight union 600 is similar to the first embodiment union 100 of FIG. 1, with the exception that the rubber O-ring seal 116 has been replaced by a crushable metal seal 616. The metal seal 616 may be made of a single metal, such as copper or aluminum, or it may be fabricated from an alloy, such as brass or soft stainless steel. The crushable metal seal 616 may also be made of two metals, such as silver-plated copper or brass. The first annular fitting 101 of FIG. 1 has been modified to included an annular projection 631, which provides high pressure during tightening of the retainer ring 113 to deform the seal 616. The annular projection 631 of the modified first annular fitting 601 is positioned within a corner 617 of a cylindrical recess 618.

Figure 7:
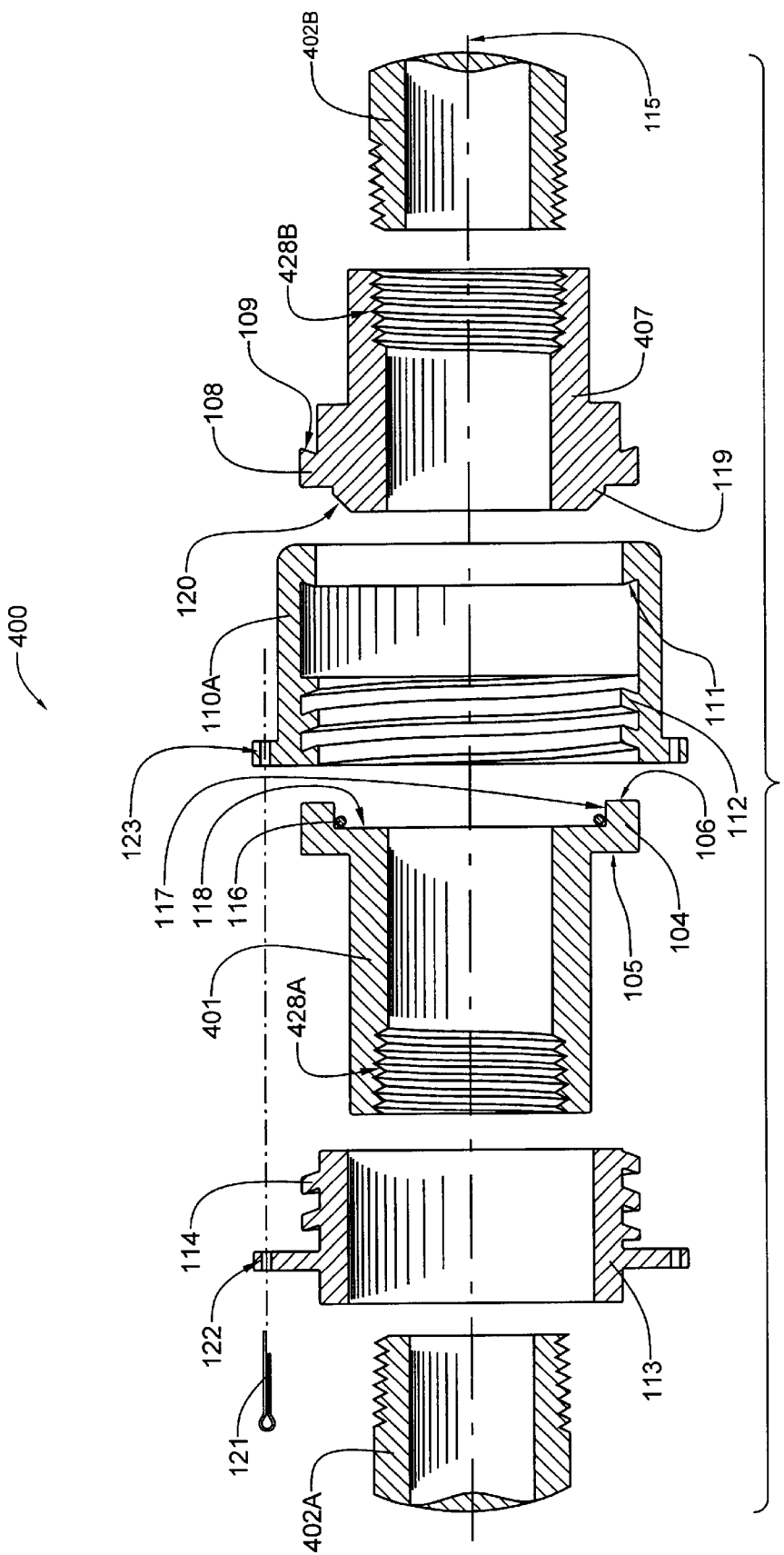
FIG. 7 is an exploded cross-sectional view of the fourth embodiment of the fluid-tight pipe union shown in FIG. 4.

Referring now to FIG. 7, a fourth embodiment fluid-tight union 400 is shown in an exploded view in combination with the ends of two pipe sections 401A and 401B, which are to be connected with the union 400. It will be noted that left-handed threads are shown on both the clamping collar 110 and on the retainer ring 113. However, right-handed threads, which would be the mirror image of those shown, may also be used.

Figure 8:
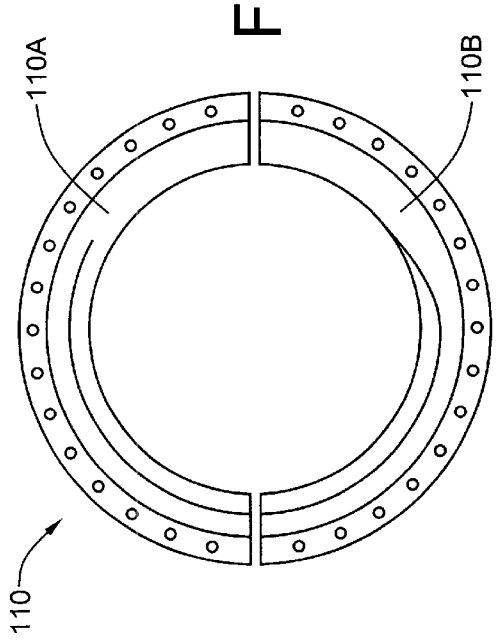
FIG. 8 is an end view of a pair of non-interconnected arcuate segments which comprise a first embodiment of the clamping collar.

Referring now to FIG. 8, both arcuate segments 110A and 110B of a first embodiment clamping collar 110 are visible in this end view.

Figure 9:
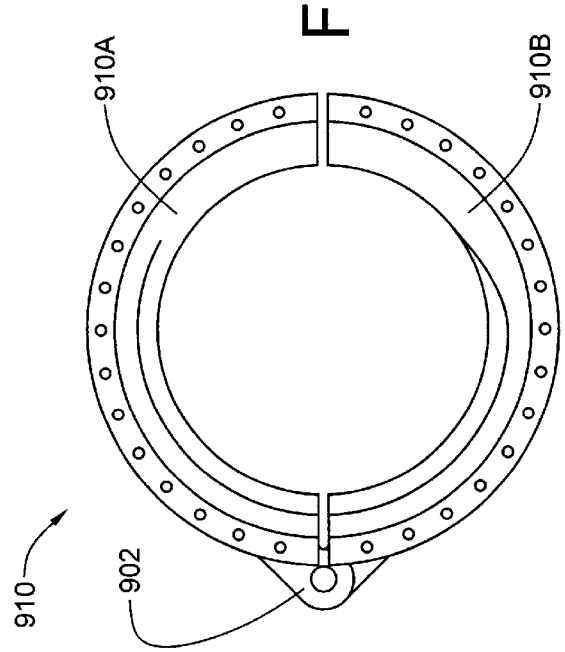
FIG. 9 is an end view of a pair of closed, hingeably-interconnected arcuate segments which comprise a second embodiment of the clamping collar.

Referring now to FIG. 9, a second embodiment clamping collar 910 has a pair of arcuate segments 910A and 910B which are interconnected by means of a hinge 902.

Figure 10:
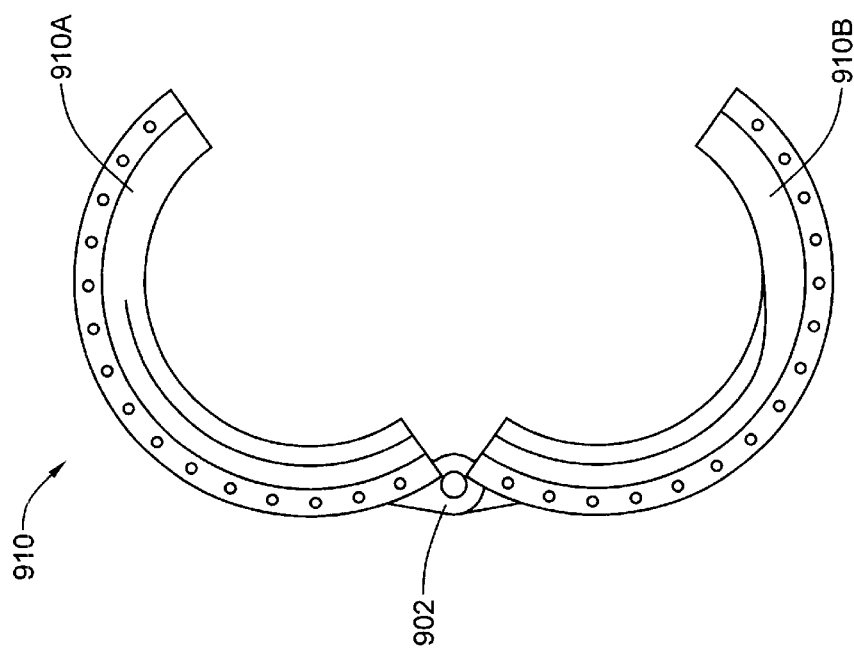
FIG. 10 is an end view of the pair of open, hingeably-interconnected arcuate segments shown in FIG. 8.

Referring now to FIG. 10, the second embodiment clamping collar 910 has been opened to facilitate its installation around the first and second annular fittings 101 and 107, or 201 and 207, or 301 and 307, 401 and 407, or 501 and 507.

Figure 11:
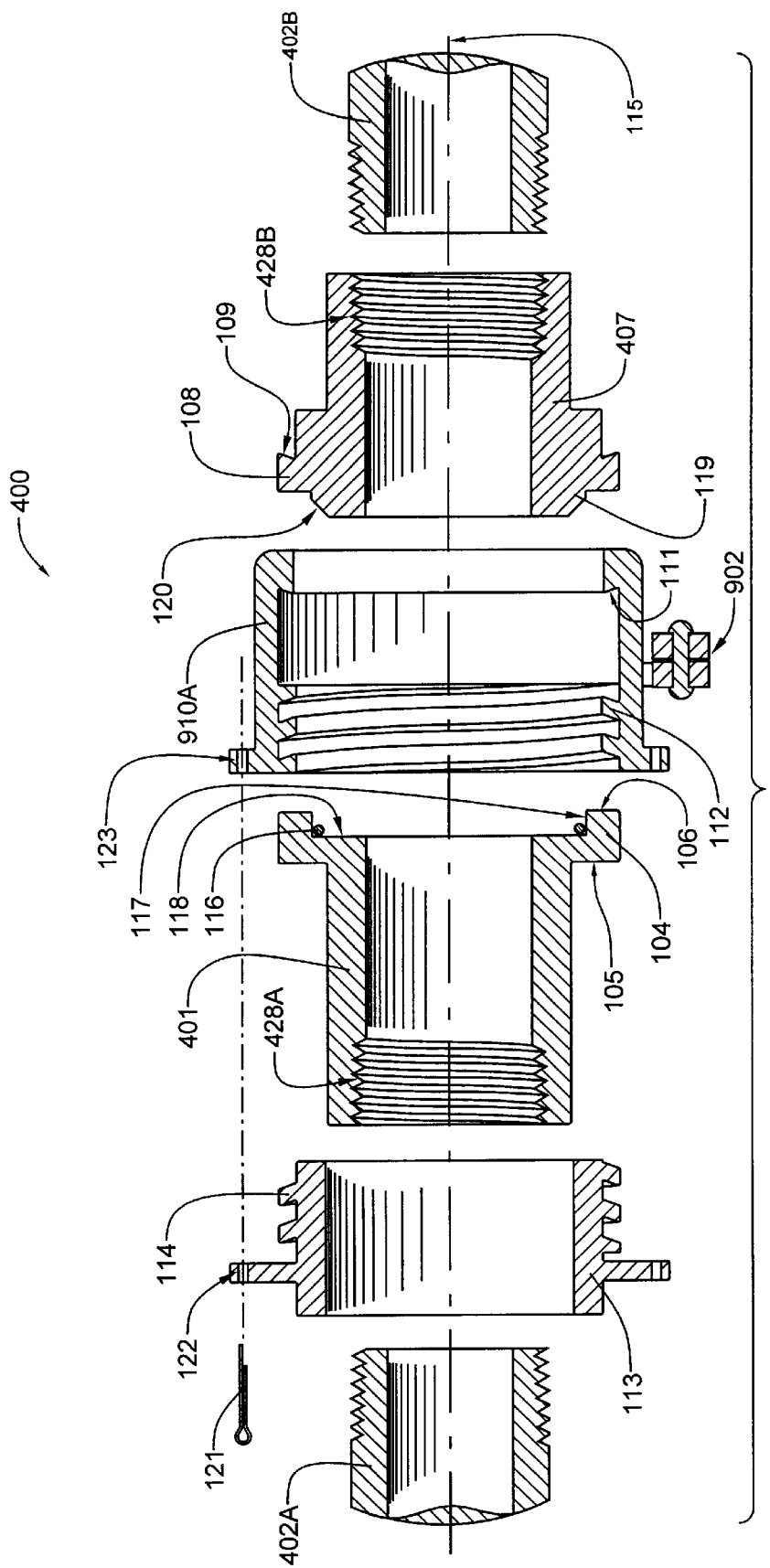
FIG. 11 is an exploded cross-sectional view of the fourth embodiment of the fluid-tight pipe union modified with a clamping collar having hingeably-interconnected arcuate segments.

Referring now to FIG. 11, the fourth embodiment union 400 is shown modified to incorporate the clamping collar 910 of FIG. 9, which has arcuate segments 901A and 901B interconnected with a hinge 902. The hinge 902 simply permits the clamping collar 910 to be more easily installed around the first and second annular fittings of the various embodiments heretofore described.

Figure 12:
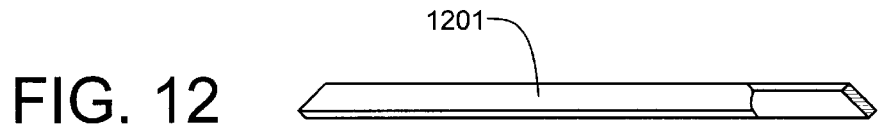
FIG. 12 is a partially cut-away, partial cross-sectional view of an undeformed metal seal used for the sixth embodiment union of FIG. 6.

Referring now to FIG. 12, an undeformed conical metal seal, of the type utilized for the sixth embodiment fluid-tight union of FIG. 6 is shown in a partially cut-away, partial cross-sectional view. Such a seal may be simultaneously stamped and formed from sheet metal.

Figure 13:
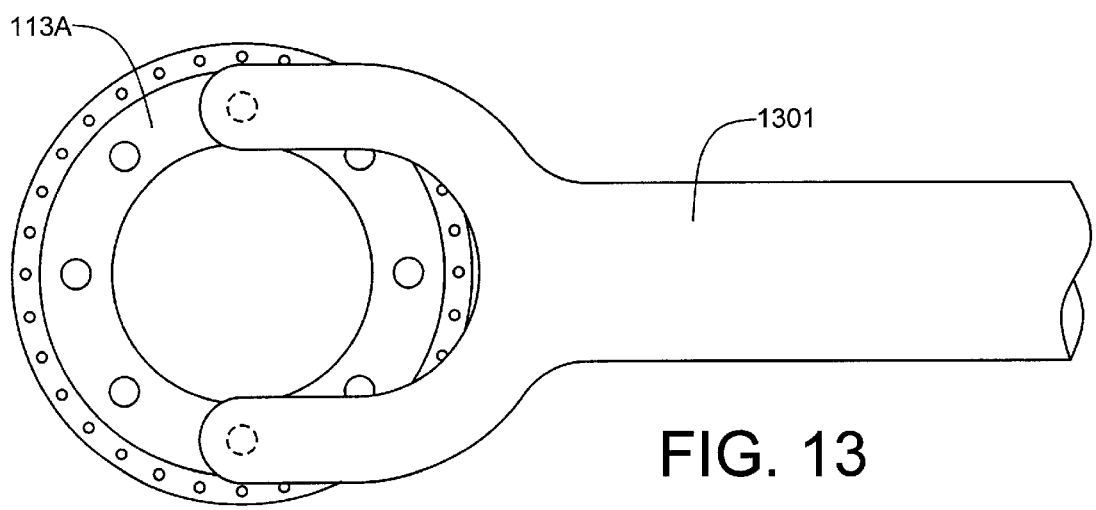
FIG. 13 is a side elevational view of a pin wrench engaged with a first embodiment retainer ring.

Referring now to FIG. 13, a first embodiment retainer ring 113A is shown having a pin wrench 1301 engaged therewith for threadably engaging the clamping collar 110 and tightening it against the rear face 105 of flange 104.

Figure 14:
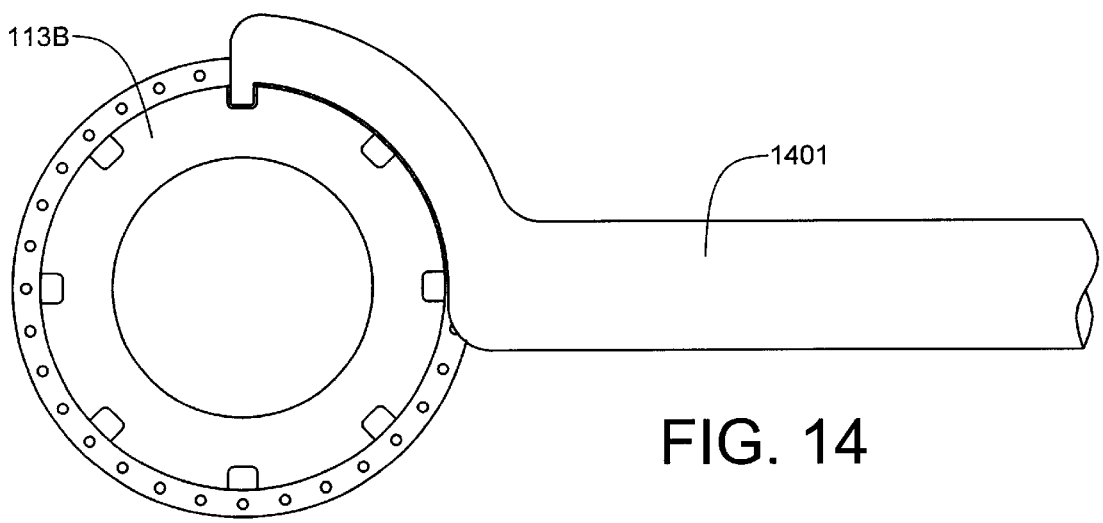
FIG. 14 is a side elevational view of a spanner wrench engaged with a second embodiment retainer ring.

Referring now to FIG. 14, a second embodiment retainer ring 113B is shown having a spanner wrench 1401 engaged therewith for threadably engaging the clamping collar 110 and tightening it against the rear face 105 of flange 104.

Figure 15:
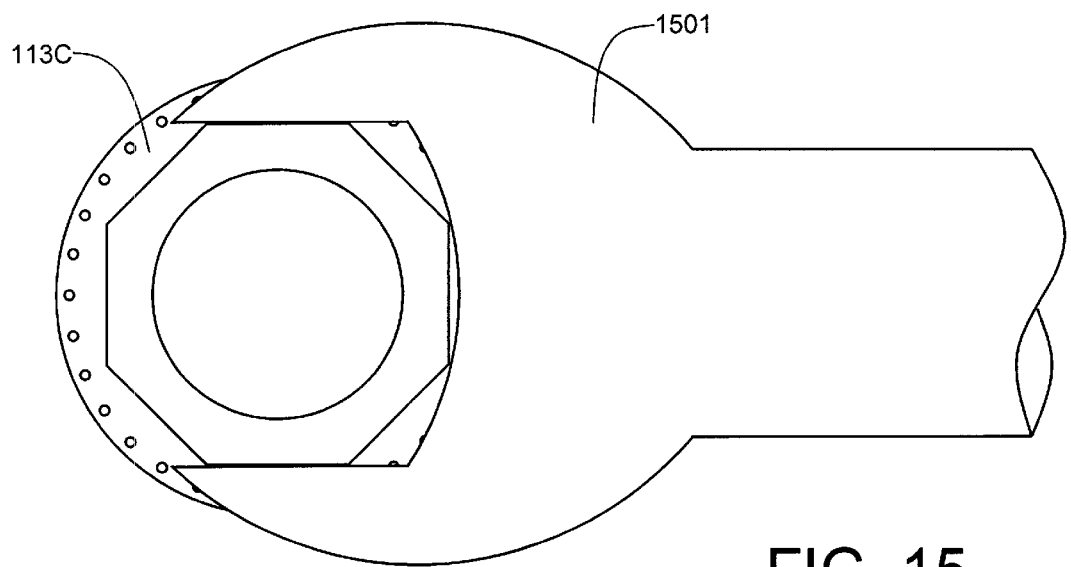
FIG. 15 is a side elevational view of an open end wrench engaged with a third embodiment retainer ring.

Referring now to FIG. 15, a third embodiment retainer ring 113C is shown having an open-end wrench 1501 engaged therewith for threadably engaging the clamping collar 110 and tightening it against the rear face 105 of flange 104.

Figure 16:
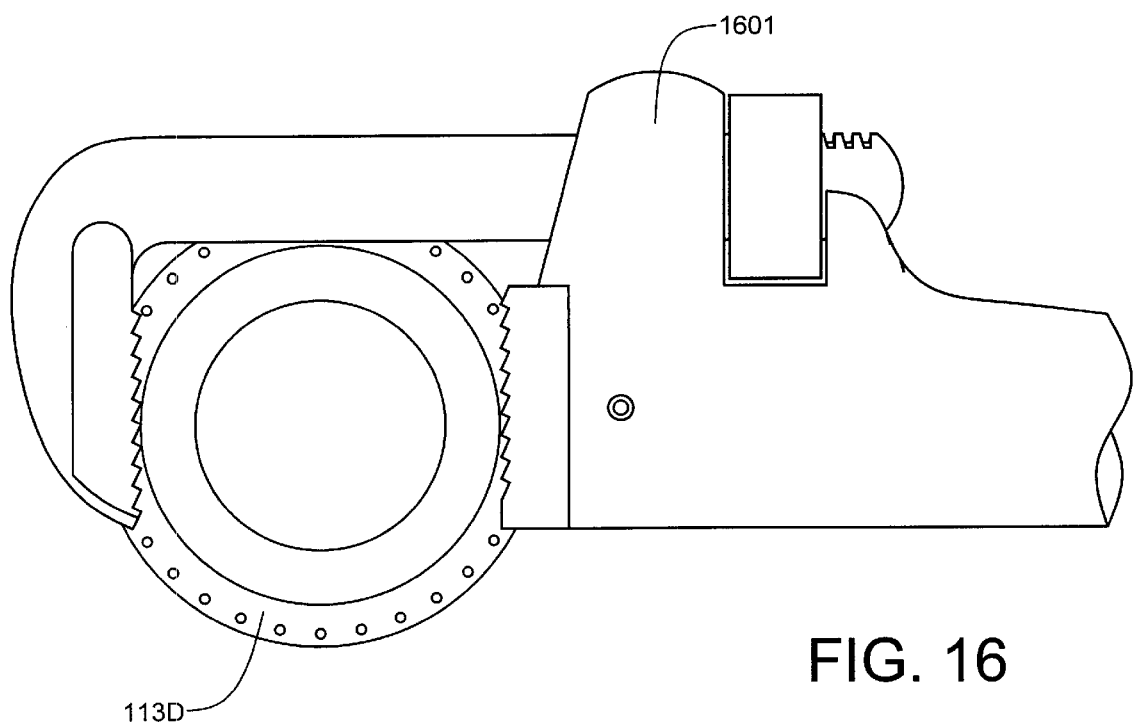
FIG. 16 is a side elevational view of a pipe wrench engaged with a fourth embodiment retainer ring.

Referring now to FIG. 16, a fourth embodiment retainer ring 113D is shown having a pipe wrench 1601 engaged therewith for threadably engaging the clamping collar 110 and tightening it against the rear face 105 of flange 104.

Although only several embodiments of the invention are shown and described herein, it will be obvious to those having ordinary skill in the art that changes and modifications may be made thereto without departing from the scope and the spirit of the invention as hereinafter claimed.

What is claimed is:

1. A fluid-tight union for reversably interconnecting first and second lengths of coaxial pipe, said union comprising:

a first annular fitting attachable to a connection end of said first length of pipe, said first fitting incorporating a circumferential flange, said flange having a rear face and front face which faces said second length of pipe;

a second annular fitting attachable to a connection end of said second length of pipe, said second fitting having a circumferential shoulder, said shoulder terminating in an inwardly-angled, overhanging circumferential step that faces away from said junction;

a clamping collar comprised of arcuate segments, which are collectively sized to generally and coaxially surround both said first and second fittings, said collar incorporating, both an inwardly-angled clamping ledge that engages the overhanging step of the second fitting and at least one internal, inwardly-angled, spiral, circumferential thread spaced apart from said clamping ledge; and a retainer ring sized so as to be slidable over said first fitting, and rotatable against the rear face of said circumferential flange, said retainer ring incorporating external, spiral, circumferential threads that are angled away from the said flange, the external threads of said retainer ring engaging the internal threads of said clamping collar to draw the clamping ledge and engaged second fitting against the flange as the retainer ring is rotated in a thread engaging direction.

2. The fluid-tight union of claim 1, which further comprises an O-ring seal compressible between said first and second annular fittings.

3. The fluid-tight union of claim 1, which further comprises a metal seal crushable between said first and second annular fittings.

4. The fluid-tight union of claim 1, wherein the external threads of said retainer ring and the internal threads of said clamping collar are generally of parallelogram cross section.

5. The fluid-tight union of claim 1, wherein said first and second fittings are circumferentially welded to said first and second pipe sections, respectively.

6. The fluid-tight union of claim 1, wherein said first and second fittings are threadably connected to said first and second pipe sections, respectively.

7. The fluid-tight union of claim 1, wherein said clamping collar is comprised of a pair of generally 180-degree arcuate segments.

8. The fluid-tight union of claim 7, wherein said arcuate segments are hingeably interconnected.

9. The fluid-tight union of claim 1, wherein the external threads of said retainer ring and the internal threads of said clamping collar are of a left-handed spiral configuration.

10. The fluid-tight union of claim 1, wherein the external threads of said retainer ring and the internal threads of said clamping collar are of a right-handed spiral configuration.

11. A fluid-tight union for reversably interconnecting first and second lengths of coaxial pipe, said union comprising:

juxtaposed first and second annular fittings, said first and second fittings attachable to connection ends of said first and second lengths of pipe, respectively, said first fitting having a cylindrical body which, at one end thereof, incorporates a circumferential flange, said flange having a front and rear parallel faces which respectively face said second and first lengths of pipe, said second fitting having a circumferential shoulder adjacent a junction with said first fitting, said shoulder terminating in an inwardly-angled, overhanging circumferential step that faces away from said junction;

a clamping collar comprised of arcuate segments, which are collectively sized to generally and coaxially surround both said first and second fittings, said collar incorporating, both an inwardly-angled clamping ledge that engages the overhanging step of the second fitting and at least one internal, inwardly-angled, spiral, circumferential thread spaced apart from said clamping ledge; and a retainer ring sized so as to be slidable over said first fitting, and rotatable against the rear face of said circumferential flange, said retainer ring incorporating external, spiral, circumferential threads that are angled away from the said flange, the external threads of said retainer ring engaging the internal threads of said clamping collar to draw the clamping ledge and engaged second fitting against the flange as the retainer ring is rotated in a thread engaging direction.

12. The fluid-tight union of claim 11, which further comprises an O-ring seal compressible between said first and second annular fittings.

13. The fluid-tight union of claim 11, which further comprises a metal seal crushable between said first and second annular fittings.

14. The fluid-tight union of claim 11, wherein the external threads of said retainer ring and the internal threads of said clamping collar are generally of parallelogram cross section.

15. The fluid-tight union of claim 11, wherein said first and second fittings are circumferentially welded to said first and second pipe sections, respectively.

16. The fluid-tight union of claim 11, wherein said first and second fittings are threadably connected to said first and second pipe sections, respectively.

17. The fluid-tight union of claim 11, wherein said clamping collar is comprised of a pair of generally 180-degree arcuate segments.

18. The fluid-tight union of claim 11, wherein said arcuate segments are hingeably interconnected.

19. The fluid-tight union of claim 11, wherein the external threads of said retainer ring and the internal threads of said clamping collar are of a left-handed spiral configuration.

20. The fluid-tight union of claim 11, wherein the external threads of said retainer ring and the internal threads of said clamping collar are of a right-handed spiral configuration.

* * * * *